United States Patent [19]

Rose

[11] Patent Number: 4,656,848
[45] Date of Patent: Apr. 14, 1987

[54] SECURITY DEVICE FOR PERSONAL COMPUTERS

[76] Inventor: C. David Rose, 7209 Ontario, Hammond, Ind. 46368

[21] Appl. No.: 644,241

[22] Filed: Aug. 27, 1984

[51] Int. Cl.$^4$ .......................... F16B 41/00; E05B 73/00
[52] U.S. Cl. ............................................ 70/58; 70/232
[58] Field of Search ................. 70/57, 58, 62, 63, 229, 70/232; 248/551, 553, 552

[56] References Cited

U.S. PATENT DOCUMENTS

| | | | |
|---|---|---|---|
| 3,664,616 | 5/1972 | Raskin | 248/553 |
| 3,707,860 | 1/1973 | Singer | 70/58 |
| 3,910,079 | 10/1975 | Gassaway | 70/58 |
| 3,945,227 | 3/1976 | Reiland | 70/58 |
| 4,065,946 | 1/1978 | Loynes | 70/58 |

Primary Examiner—Robert L. Wolfe

[57] ABSTRACT

An anti-theft device for securing personal computers to a table, bench or like top is disclosed. The device employs a strong flat bar affixed to the bottom of the table or bench top, and two units that are threaded to the bar and extend through the table top. These units have bolts that project horizontally into the computer cabinet on opposite sides of the cabinet. One of the two units is an L-shaped bolt one end of which projects into the cabinet and the other end is treaded into the bar. The other unit is a lock assembly having housing with a horizontal bolt. The housing is secured to the bar by a socket cap screw that passes through the top. A key lock unit secures access to the socket of the screw and a cap is welded to the bar to surround and cover the threaded hole and the shank of the cap screw. The projecting bolts are positioned so as to enter the cabinet of the current IBM PC models so as to prevent removal of its slide-out chassis as well as secure its cabinet to the top. A second and third embodiment each employs an additional bracket that is shaped in a generally inverted U-shape, to overlay the top and sides of a computer cabinet. The bracket has apertures for receiving the projecting bolts and provides additional security.

15 Claims, 9 Drawing Figures

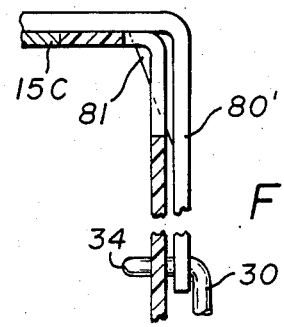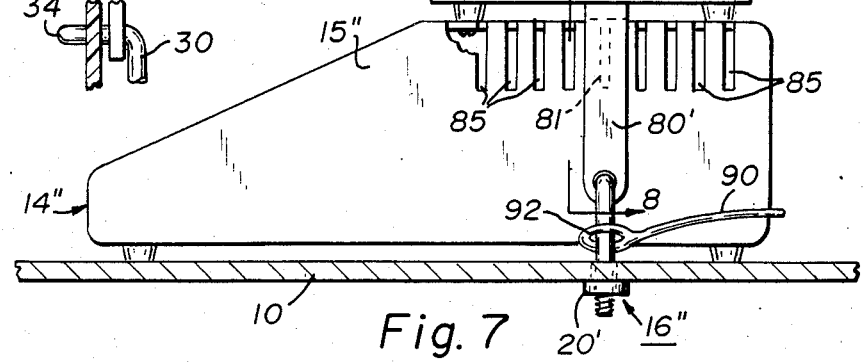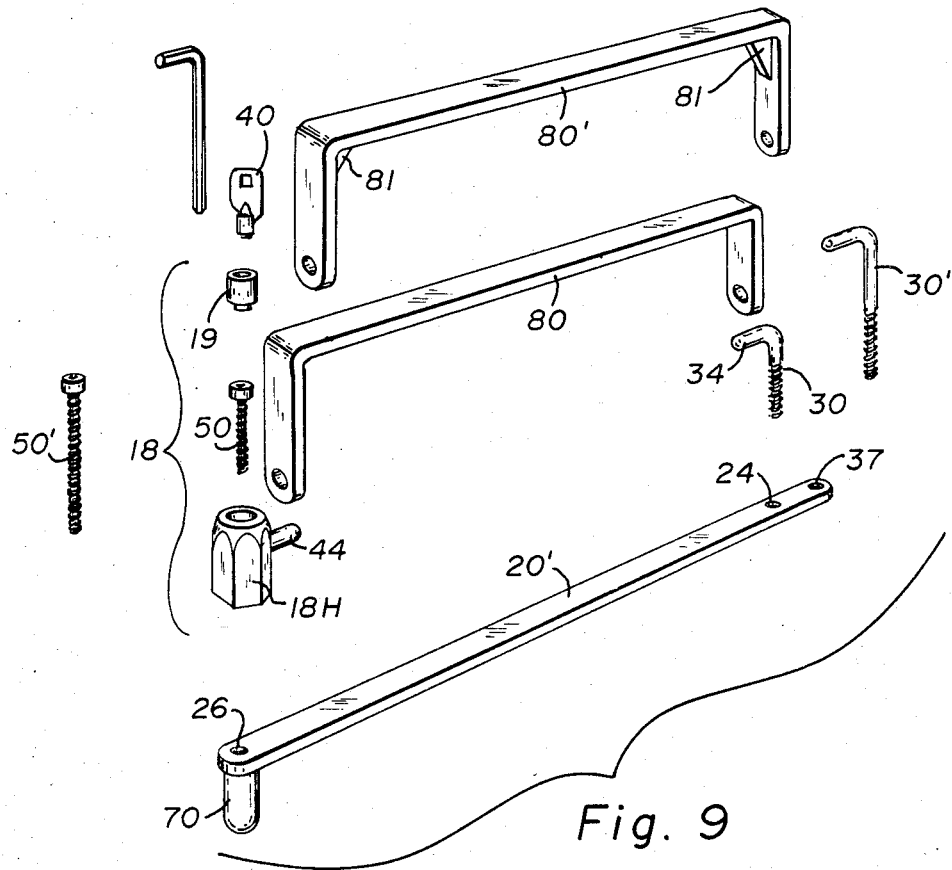

4,656,848

SECURITY DEVICE FOR PERSONAL COMPUTERS

FIELD OF THE INVENTION

The present invention relates to improved anti-theft devices and particularly to a novel device for releasably locking computers to the top of a table, bench or the like.

BACKGROUND OF THE INVENTION

With the increasing popularity of personal computers and especially their use in ever-increasing numbers at educational institutions and corporations has come problems of providing security against theft of these valuable but easily carried machines.

The present inventor has already suggested one security device especially adapted for small computers in his copending U.S. patent application Ser. No. 573,559 filed Jan. 25, 1984, entitled SECURITY DEVICE FOR SMALL COMPUTER SYSTEM. Other commercial systems are discussed briefly in that application and reference can be had to it for a discussion of the general background of this art.

While not especially adapted to small computers, many devices have been suggested for holding or locking down typewriters and like small machines. These range from the early clamps in Conde U.S. Pat. No. 497,015 issued May 9, 1893 and Throm U.S. Pat. No. 826,626, through locking frameworks such as McFarland U.S. Pat. No. 2,171,664.

The CB craze brought forth a number of suggestions for securing CB radios to automobile interiors. U.S. patents to Barding, U.S. Pat. No. 4,066,307, Daley U.S. Pat. No. 4,038,843; Reiland U.S. Pat. No. 3,945,227 and Artner U.S. Pat. No. 3,766,759 are examples.

Also general security boxes that can be fastened to an automobile or other less easily moved object have been suggested. Examples of these are U.S. patents to Miller U.S. Pat. No. 4,249,684 and Sears U.S. Pat. No. 4,248,067.

A number of devices for securing a machine to a table top are to be found, notably Wann U.S. Pat. No. 3,321,165 (May 23, 1967); Buchman U.S. Pat. No. 3,514,172; Gassaway U.S. Pat. Nos. 3,850,392 and 3,910,079 and 4,007,613; Shontz U.S. Pat. No. 3,990,276; Bennett U.S. Pat. No. 3,564,879; Hemphill U.S. Pat. No. 3,744,282; Singer U.S. Pat. No. 3,748,879 and Raskin U.S. Pat. No. 3,664,616. This is usually accomplished by installing a bolt from the interior of the device downward. This requires disassembly of the unit to be able to remove the unit from the locking device. Alternatively, prior devices inconveniently require access to the underside of the table or desk to unlock the device and release the unit secured.

Devices requiring disassembly of a computer to remove it from the table top are undesirable because they expose complicated and delicate electrical circuitry to possible damage. Thus, despite all of these suggestions there exists the need for an easily installed and easily used security device that does not require disassembly of the computer housing to remove the unit from the device, that can adapt to a variety of table and counter tops and yet also does not materially interfere with the utility of the computer nor require the use a great deal of bench, desk or table top surface for the security device, all while providing a material deterrence to theft.

SUMMARY OF THE INVENTION

A security device for a computer or like unit constructed in accordance with the present invention includes a strong bar for positioning under a table or bench top. The bar has spaced-apart threaded holes. A bolt member is provided having a vertical threaded shaft capable of being threaded into one of said holes and a horizontal bolt projection capable of insertion into a closely fitting hole on one side of the cabinet of the unit. A locking assembly for use on the top of the table is also provided having a housing with a horizontal bolt projection capable of insertion into a closely fitting hole in the other side of the cabinet. The locking assembly is threadably bolted to the other threaded hole in the bar. And a lock is provided on that assembly for securing the lock assembly in place.

With the device, the bar may be placed and preferably affixed under the top of a table or bench, the bolt member threaded down into it (through a hole in the top) and a computer slid into place with the projecting bolt within it.

The locking assembly may then be positioned with its bolt projecting into the other side of the computer, secured to the bar, and locked. The process may be reversed for releasing the computer.

This device thus provides an easily used and installed but secure anti-theft device. Because it does not invade the computer from the bottom, or require internal affixture of bolts or nuts, there is no need to disassemble the computer to remove it from the device. As there are no parts affixed to the computer, no danger exists to its delicate components in removing it or restoring it back into the security device.

Thus the present invention provides an easily installed and easily used security device that does not require disassembly of the computer housing to remove the unit from the device, can adapt to a variety of table and counter tops and also does not materially interfere with the utility of the computer can be opened entirely from the top and yet does not use a great deal of bench, desk or table top surface, all while providing a material deterrence to theft of the computer.

The invention, together with further advantages thereof, may best be understood by reference to the following description taken in connection with the accompanying drawings, in the several figures of which, like reference numerals identify like elements.

BRIEF DESCRIPTION OF THE DRAWINGS

FIG. 7 is an elevational side view of a third embodiment of the invention shown securing yet another type of computer to a bench or like top with some interior parts shown in phantom lines which is shown in section, and some parts broken away to show interior parts.

FIG. 8 is a sectional view on an enlarged scale of a portion of the computer and device of FIG. 7, partly broken away shown as seen from the plane of the line 8—8 in FIG. 7, looking in the direction of the arrows.

FIG. 9 is an exploded view of the parts of security devices the alternative parts also shown.

DETAILED DESCRIPTION OF THE PREFERRED EMBODIMENTS

Figure 1:
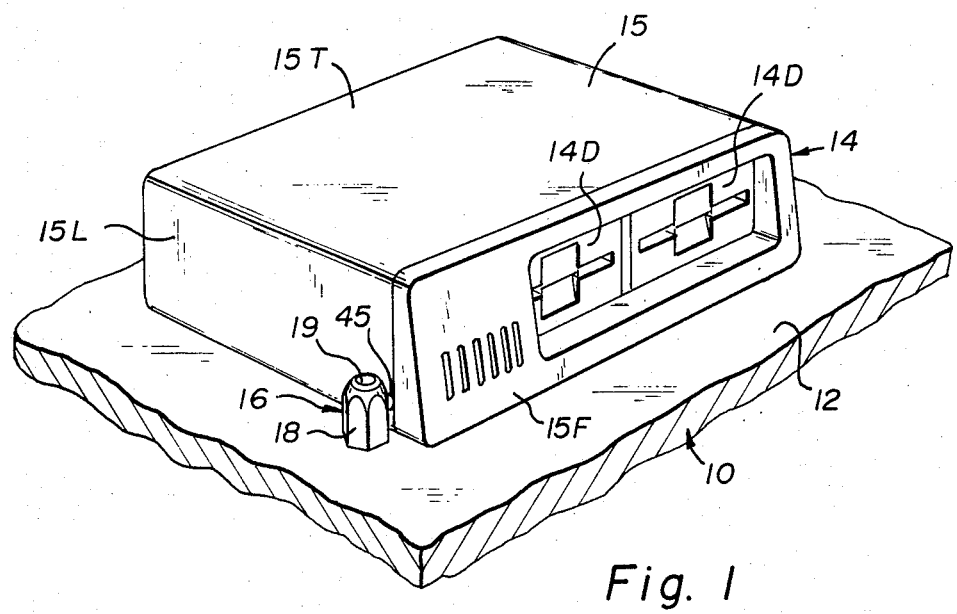
FIG. 1 is a perspective view of a personal computer secured to a table top by a security device constructed in accordance with the present invention.

Referring to FIG. 1 there is depicted a table or counter top 10 having an upper surface 12 on which is set a personal computer 14 having a cabinet 15. The particular computer 14 shown in FIG. 1 is the IBM PC brand computer. The computer 14 is shown in its normal operational arrangement with a pair of disc drives 14D incorporated in the cabinet 15 and positioned toward the user.

Commercial IBM PC brand computers such as the computer 14 have been produced and marketed in large numbers and now constitute a significant part of the total stock of all personal computers in current use. This type of computer is housed in a cabinet that surrounds a chassis that is generally shaped like a tray and onto which the operational computer components such as disc drives 14D are mounted. The cabinet 15 comprises a front wall 15F through which an escutcheon opening is provided for access to the drives 14D. The cabinet front wall 15F is secured to a metal top wall 15T and metal side walls 15L and 15R. The walls 15T, 15L and 15R are formed from a single sheet of steel and provide a strong tamper-resistant cover.

Also shown in FIG. 1 is part of a security device 16 which is constructed in accordance with the present invention. As can be seen from that figure, the device 16 is unobtrusive in use with a lock assembly 18 presenting a key lock 19 at a convenient and easily reached location just adjacent to a left side wall 15L of the cabinet 15 and near the front wall 15F of the cabinet 15.

As better seen in FIG. 2 the device 16 includes a strong bar 20 located below the table top 10. The bar 20 is preferably of flat steel stock and is somewhat longer than the width of the computer 14. The bar 20 is preferably secured to the bottom surface 13 of the top 10 by means of screws 22 or by other convenient means.

Figure 2:
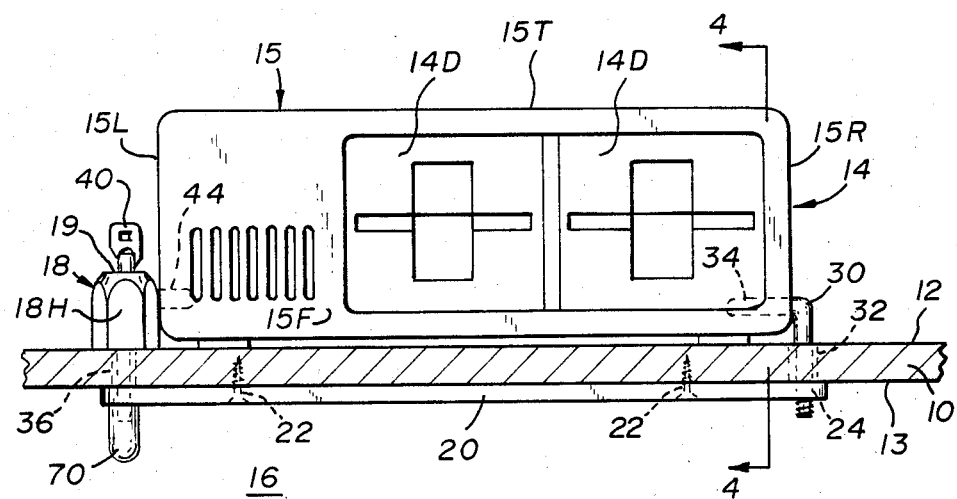
FIG. 2 is a partly sectional front elevational view of the device, computer and top of FIG. 1, with interior parts shown in phantom lines.

At one end of the bar 20 (the right end as seen in FIG. 2) is provided a threaded hole 24 into which the threaded shank of a bolt member 30 is threadably received. The member 30, which forms part of the device 16, passes through a hole 32 drilled or otherwise suitably formed in the top 10 and rises above the level of the table's upper surface 12. The bolt member 30 is bent into a 90 degree elbow to form a horizontal bolt projection 34 that passes through a suitably sized hole in the right side-wall 15R of the cabinet 15 and projects into the interior of the computer 14. The lock assembly 18 rests on the table surface 12 but is secured to the bar 20 through a hole 36, similar to the hole 32, through the top 10. The assembly 18 includes a housing 18H from which is provided a horizontal bolt projection 44 that enters the cabinet 15 through a hole 45 (FIGS. 1 and 3) in its side-wall 15L and projects inside the computer. Also shown in FIG. 2 is a key 40 for the lock 19.

Figure 3:
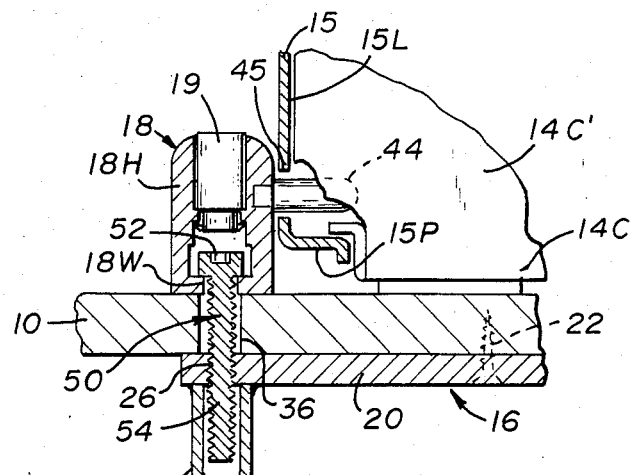
FIG. 3 is a detailed larger scale sectional view of a portion of the device, top and computer of FIGS. 1 and 2.

As better seen from the detailed view of FIG. 3 the cabinet 15 side-walls such as wall 15L have an internally projecting rim 15P. As better seen from FIGS. 3 and 4 the chassis 14C forms a drawer-like unit which is slidably received by the cabinet 15. Thus the cabinet 15 is removed by either sliding the cabinet cover out of the chassis frontwards (to the left in FIG. 4) or sliding the chassis 14C rearward (right in FIG. 4).

Referring specifically to FIG. 3, it can be seen that the projecting bolt 44 of the lock assembly 18 enters the cabinet 15 and is positioned behind a vertical wall 14C′ portion of the chassis 14C and thus prevents the sliding separation of the chassis and cabinet 15C.

Figure 4:
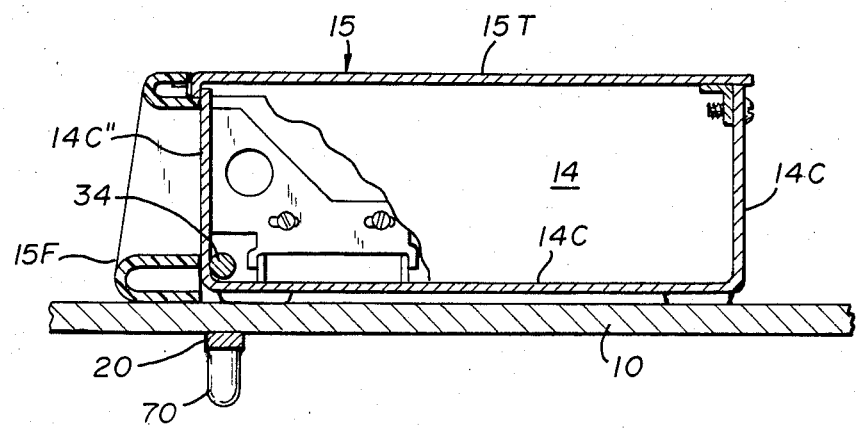
FIG. 4 is a sectional view of the device, computer and top of FIGS. 1-3 as seen from the plane defined by the line 4—4 in FIG. 2, looking in the direction of the arrows, with certain parts omitted for ease of illustration.

Similarly as shown in FIG. 4, the projecting horizontal bolt 34 extends behind another portion of the chassis that forms a vertical front wall 14C″ of the chassis 14C to similarly prevent the separation of the chassis and cabinet. (In FIG. 4, for convenience in illustration, the circuit board, disc drives and other components mounted to the chassis 14C are omitted.)

As it can also be appreciated from FIGS. 3 and 4, the locking unit 18 includes a hex-socket cap screw 50 that has its head 52 seated within the housing 18H of the lock assembly 18 and projects below it through a hole 18W sized to receive its shank 54. The threaded shank 54 passes through the hole 36 drilled or otherwise formed through the top 10 and is threadably received in the threaded hole 26 formed in the bar 20. A strong case-hardened metal cap 70 preferably is welded or otherwise securely affixed over the underside of the bar 20 over the opening 26 to turn it into a "blind" hole— one that is not accessible from the bottom. The cap 70 provides protection for the bottom of bolt 50 to prevent it backed out. The cup 70 is of sufficient depth so as to allow the device 10 to be adapted to different thicknesses for the top 10. The bolt 30 (FIG. 2) can also accommodate different thicknesses for the top 10 by being threaded deeper or shallower in the hole 24. To allow the alignment of bolt projection 34 to the hole in the side-wall 15R the matched threading of the bolt 30's shank and the hole 24 is of a low pitch, (e.g. 20 UN-F-2A twenty threads per inch on seven-sixteenths, [7/16] inch diameter case hardened steel). The lock 19 is of the cylinder type, generally similar to that shown in U.S. Pat. No. 3,748,879, which is removable to provide access to the screw head 52. The lock 19 thus serves as a cover as well as a lock.

Installation

To install the device 16, the user need only mark the location for the computer 14 on a table top 10 remove it and drill holes 32 and 36 (sized slightly larger than the diameters of the shanks of bolt 30 and screw 50), align the flat bar 20 under the table so that its threaded holes 24 and 26 are under these openings 32, 36 and secure it by screws 22. The bolt unit 30 is then screwed into the approximate position shown in FIG. 2.

Note should be made of the fact that the device 16 can accommodate tops of differing thicknesses by simply threading the unit 30 and screw 50 deeper or shallower in the bar 20.

The computer 14 is prepared by removing the cabinet 15 from the chassis and forming holes sized only slightly larger than the projections 34, 44 at pre-determined indicated areas. (On the current IBM PC this would be approximately 1¼ inches from the table surface 12 and just behind the front escutcheon 15F). The cabinet is then replaced on the chassis 14C. (This operation need only be done initially on any particular chassis, it is not thereafter necessary to disassemble the cabinet 15 from the chassis 14C in using the device 16.)

To lock the computer 14 operation in place using the security device 16, the computer is placed on the top surface 12 and slid so as to have the projection 34 enter the hole formed in the side-wall 15R. At the initial occasion (and not necessary thereafter) it may be more convenient to adjust the height of the bolt member 30 at this time to make sure its projection 34 easily slides into the hole.

The computer 14 is then moved into the alignment shown in FIG. 1 and the housing 18H of the lock assembly slid on the top 12 so that its bolt projection 44 enters the hole formed to receive it in the wall 15L. The screw 50 is then placed in the housing 18H so that its shank drops through the holes 18W and 36 and, using a hex type wrench (FIG. 9) is threaded into the threaded hole 26 until its head 52 is finally seated on the bottom of the housing 18. At this point, the lock 19 is inserted and the key 40 turned and removed to lock it in place, covering the screw 50.

This completes the locking of the computer 14 which is now secured in place to the table. Note that the bolt 24 can not be "backed out" or turned by a potential thief as the computer chassis and cabinet prevent its turning. Similarly, the cap 70 prevents access to the bolt 50. The only easily attacked part of the device is the optional screws 22; but to remove these in no way lessens the strong hold of the device on the computer and the table top. Indeed, the screws 22 or any other fasteners to the table bottom are optional in that they are not needed once the device is installed. However, they are useful in keeping the bar 20 in place when the computer is removed temporarily, as for servicing. [Of course, other means besides screw 22 for affixing the bar 20 can be used such as adhesive covered by release paper. The means for affixing need be only strong enough to hold up the weight of the bar and associated parts].

To unlock the computer 14, one needs the key 40 and a (hex-type) wrench sized to the socket of the bolt 50. To unlock the device and free the computer 14, the user places the key in the cylinder lock 19, turns and removes it. Then using a (hex-type) wrench (preferably one having a long shank), the bolt 50 is loosened and removed. At this point the housing 18H can be slid to disengage the bolt projection from the hole in the cabinet 15 and the computer 14 slid to disengage the projection 34 from the cabinet and completely free the computer 14.

Second and Third Embodiments

The principles of the present invention, while especially valuable when applied to the IBM PC brand computer are also applicable to other computers and similar units.

Figure 5:
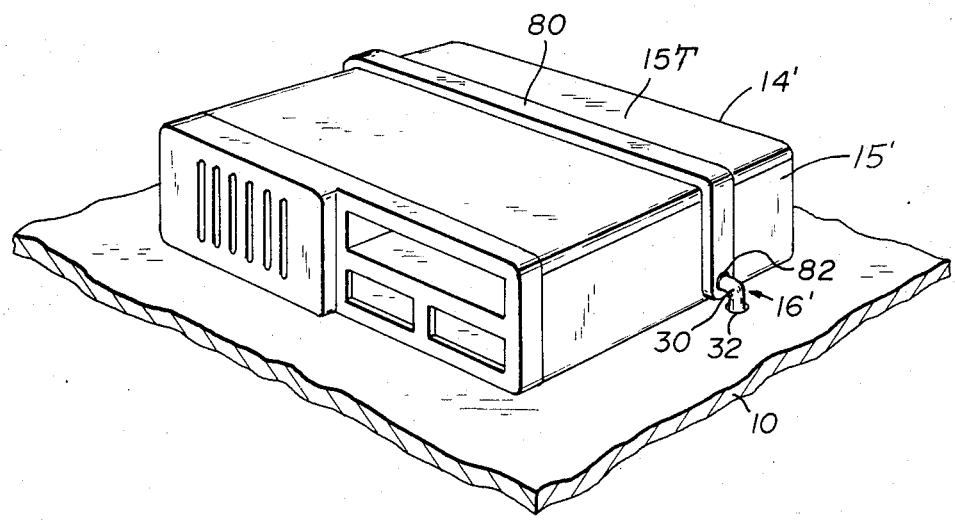
FIG. 5 is a perspective view of a second embodiment of the invention shown in use in securing another TYPE of personal computer to top.
Figure 6:
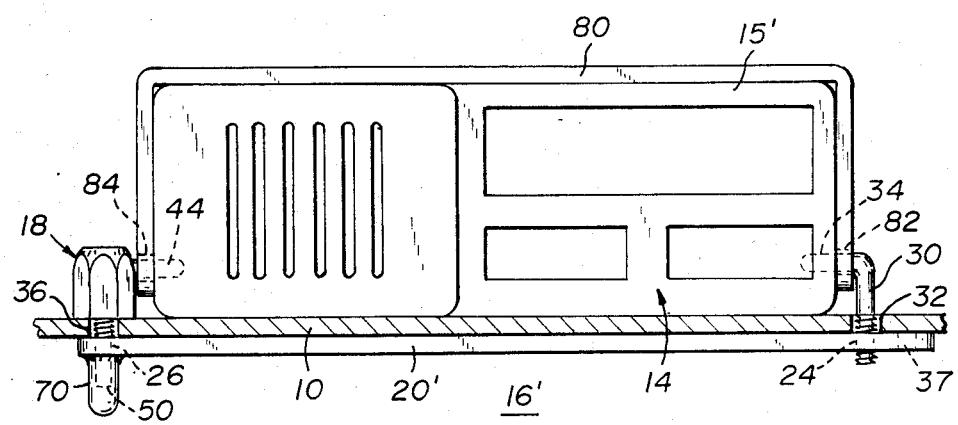
FIG. 6 is an elevational front view, partly in section 3 of the device, computer and top of FIG. 5.

Referring to FIGS. 5 and 6 there is depicted a second embodiment of the invention in use on an IBM PCjr brand computer 14'. In this embodiment the device 16' is similar as to that of the device 16 of FIGS. 1-4 but includes a strong helper bracket 80. The bracket 80 is in the general shape of an inverted U closely conforms to the housing 15' of this computer 14'. The bracket 80 has apertures or openings 82 and 84 at its downward pointing arms for receiving the projections 34 and 44 of the device 16'. In this case, because the width of this computer is less than that of the IBM PC computer, the bar 20' may be, as shown, shorter than that of the previous embodiment but otherwise functionally the same. The bracket 80 together with the units 18 and 30 and the bar 20' form a strong encircling band around the computer 14' and the table top tying the two strongly together.

As several commercial computers are of similar but not identical widths, it is practical to use a single bar 20' with several threaded holes to accommodate whichever unit is used. To this end a second threaded hole 37 is shown in FIG. 6.

The particular computer 14' has a plastic housing a cabinet 15'. The computer 14' is opened from the top by lifting a flat lid 15T upward and by sliding it toward the rear. As such, the bracket 80 serves to defeat those who might attempt to steal the internal components of the computer 14' by opening an otherwise secured cabinet. It also serves to provide a stronger steel material about the holes in the cabinet 15' that receive the bolt projections 34 and 44. This serves to discourage attempts to remove the computer 14' from the security device 16' by breaking the cabinet in the area of those bolt projections. Note should be made of the fact that the depicted table 10' is of a different thickness than that of the table 10' of the previous embodiment (FIGS. 1-4) and that the security device 16' can easily accommodate the different thicknesses.

Referring to FIGS. 7 and 8 there is depicted a third embodiment of the invention in use with yet another computer 14", in this case, the Apple IIe brand. In this machine, a plastic cabinet 15" is also used. The cabinet 15" is also opened from the top. As such, a bracket 80' is employed as part of the device 16". The bracket 80' is sized to fit closely over the cabinet 15" and to conform to its shape. The bracket 80' also preferably has an inner corner fin 81 welded or otherwise secured at each of its internal corners and sized and shaped so as to enter one of ventilation slots 85 in the cabinet 15". As the Apple IIe and the IBM PCjr computer are near the same size, the same bar 20' may be used as in the second embodiment (FIGS. 5 and 6) except that the bolt unit is threaded into the hole 37 (FIG. 9).

Referring to FIG. 9, there is depicted the components of the locking device 16' and its associated key and hex (allen) wrench in an exploded view. The alternative bracket 80' as well as alternative larger bolts 50' and bolt member 30' are also depicted. (These latter two alternatives are for use for the relatively rare occasions when the computer is to be secured to an extremely thick table or bench top.)

Installation of Second and Third Embodiments

The security devices 16' (FIGS. 5-6) and 16" (FIGS. 7-8) would be installed in the same manner as device 16 (FIGS. 1-4), except that the distance between the holes 32 and 36 (FIG. 6) through the top would be adjusted to allow for the thickness of the bracket 80 or 80' and that bracket would be fitted over the computer 14' or 14" prior to inserting of the bolt projections 34 and 44 which, of course, would first pass through the bracket holes before entering the computer cabinet.

If the optional fins 81 are employed on the bracket 80' the holes in the side wall of the Apple IIe must be aligned carefully with a slot 85. During assembly of the bracket 80' on the computer the corner fin 81 will drop into the slot to provide even greater resistance to sliding the computer out of the device 16".

As illustrated in FIG. 7, the device 16" can be employed to also secure a disc drive 88 or a pair of disc drives by securing them to the underside of the cover 15" of the computer 14" as by screws 89. In such a case, the bracket 80' which is sandwiched between the cover 15" and the disc drive 88 and the bolt 30 and lock assembly 18 also prevents removal of the drive 88 or access to the screw heads of the screw 89.

Typically, of course, a computer has additional components such as a monitor, keyboard, and printer. While these are often not as valuable as the computer proper, it may well be desirable to secure these against theft also. The invention aids in this as it allows a security cable, e.g., a plastic coated steel aircraft type cable, to be passed through such units and secured to the interior of the chassis or to cabinet of the computer or preferably to the lock assembly 18 or the member 30. In either case, the cable can't be easily disconnected without first unlocking the security device of this invention. As shown in FIG. 7, a cable 90 with one or more loops 92 can be secured over the bolt member 30 (or the locking assembly 18 or both) and runs through the peripheral devices. Thus locking the security device 16" would also lock the cable 90 and any equipment connected thereto.

Prototypes of the invention, substantially similar to those depicted and described herein have been made, tested and demonstrated to work effectively. Such prototypes were generally similar to those depicted herein, however, for convenience in manufacture the housing 18H of lock assembly 18 had its member defining hole 18W made by welding in place a pair of suitable washers. (It is also possible to use strong snap rings in forming this member and the inventor may decide to use such in the future.)

As presently contemplated, the device of the invention would preferably be constructed primarily of case-hardened steel. For purposes of illustration and not limitation, the following values and sizes are given. These are the inventor's currently contemplated way of practicing this invention however, he may, of course, in the future based upon experience or for other reasons decide to employ other sizes, materials and arrangement of parts.

Bar 20, 20': Case-hardened 0.008/0.01 deep 1018 steel, ¾" by ⅜" by 22½ inches (bar 20) or 17½ inches (bar 20'), chrome plated.

Cap 70: ¾ inch diameter, 1⅛ long to receive 5/16 inch bolt, case-hardened and chrome plated.

Bolt projection 44: 7/16 inch diameter, 1⅛ inch projection (1⅜ inch overall length) 4140 steel, cold drawn, annealed through hardened and chrome plated.

Lock 19: Chicago Lock Co. removable plug lock No. 4127-19.

Housing 18H: 1 5/16 inch hex 1.9 inch high, 1018 steel, case hardened and chrome plated.

Cap Screw 50: 5/16 inch–18×1-⅜ inches socket head cap screw (GR. 5 hardness).

Bolt Unit 30: 7/16 inch diameter, with an overall length of about 4 inches having a projection bolt length of 1 inch for devices 16' and 16" (FIGS. 5–9) and 2 inches for device 16 (FIGS. 1–4), with its shank threaded for about two and five-eighths inches, with (20-UNF-2A) thread made of 4140 cold drawn annealed and through hardened steel, chrome plated.

Bracket 80 and 80': 1018 steel, 1"×⅛" heat treated and chrome plated sized to fit the cabinet.

It should now be apparent that a new and improved security device for personal computers has been described and depicted. The security device is simple and convenient to install and use and is economical to manufacture. It is economical to manufacture in that the design lends itself to the use of standard materials and processes. The security device of this invention provides a maximum of security with a minimum of interference with use of the computer and with a minimum use of table top space. It is unobtrusive and non-disruptive in appearance. It provides a strong bar 20 or 20' positioned so as to be difficult for a thief to attack it. The secure locking bolts and lock assembly are also difficult to defeat. The security device can readily adapt itself to a variety of table or bench top thicknesses.

The invention can be applied in a number of different manners. For example, for even greater security, e.g. when a particular expensive personal computer is to be protected a second security device can be installed at the rear of the computer parallel to and spaced from the first security device. Also, a second lock assembly 18 could be used in place of the bolt member 30. (In this case a second cap 70 may be welded over the hole 24.) This would be especially called for if for some reason, such as space limitations, the computer could not be slid onto bolt 30.

The invention may be adapted into a number of forms besides those disclosed. For example, the bracket could be made so as to encircle the computer and could be of other shapes. It could be provided with short depending pins that, like the fin 81 (FIGS. 7 and 8) enter into holes or depressions formed in the cabinet.

While three particular embodiments of the invention have been shown and described, it will be obvious to those skilled in the art that changes and modifications may be made without departing from the invention and, therefore, the aim in the appended claims is to cover all such changes and modifications as fall within the true spirit and scope of the invention.

I claim:

1. A security device for securing a personal computer or like unit having side-walls to a bench, table or like top, comprising:

an elongated bar having a length longer than a horizontal dimension of the unit, said bar being adapted for positioning under the top;

first means for providing a horizontally-projecting bolt, said means being capable of being releasably secured through the top to said bar at first location therealong and said horizontally-projecting bolt capable of being received in a hole defined in a side-wall of the unit as the unit is moved horizontally on the top;

second means for providing a second horizontally-projecting bolt capable of being received in a hole defined in another side-wall of the unit, said second means being capable of being releasably secured through the top to the bar at a second location therealong, which second location is spaced from said first location a distance approximately equal to a horizontal dimension of the unit, so that the unit can be positioned between the first and second means when they are affixed to said bar; and one of first and second means being adapted to be moved horizontally on the top prior to securing to the bar so as to allow its horizontally-projecting bolt to enter a hole in the unit and that means thereafter be secured to said bar, whereby the device may be installed on a top and the unit positioned to receive one of the horizontal bolts of said means in one of its side-walls, and the other horizontal bolts received in its other side-wall with both means secured through the top to the bar so as to releasably secure the unit to the top.

2. The invention of claim 1 wherein:
said first and second means each is threadably securable to said bar so that the device may be adjusted to different thicknesses of tops by threading deeper or lower into the bar.

3. The invention of claim 2 for use with a personal computer of the type which has a chassis and a cabinet that is slidably received on the chassis, wherein:
said horizontally protruding bolts may project into the cabinet so as to prevent the slidable removal of the chassis from the cabinet.

4. The invention of claim 2, wherein:
said one of said first and second means has a housing from which said horizontal bolt projects and which housing is adapted for being positioned on said top and for enclosing the head of a removable cap screw that serves to threadably secure the housing to said bar, and
said housing is provided with a lockable cover for selectively covering and uncovering the head of said cap screw.

5. The invention of claim 4 wherein:
said lockable cover is a key-operated cylinder lock;
said cap screw has a socket head for being driven by a wrench,
whereby both a proper key and a wrench sized to the cap screw head are needed to easily release the unit from the device.

6. The invention of claim 1; wherein:
a bracket is provided for closely overlaying the unit which bracket extends down its sides, said bracket having openings at each side extension for also receiving said projecting bolts.

7. The invention of claim 5, wherein:
said bar has means for blinding the threaded hole that said cap screw is received into so that the threaded shank of said cap screw is not exposed to the underside of said bar.

8. A security device for a computer or like unit of the type that has a cabinet and is positioned on a bench, table or like top for use, comprising:
a strong bar for positioning under the top, said bar having threaded spaced apart holes for receiving threaded shanks therein;
a bolt member having a vertical threaded shank capable of being threaded into one of the holes of said bar, and said bolt member also including a horizontal bolt projection capable of insertion into a closely fitting hole on one side of the cabinet of the unit;
a locking assembly for use on the top of the table having a housing with a horizontal bolt projection capable of insertion into a closely fitting hole in the other side of the unit, said locking assembly having means for securing it to the other threaded hole in the bar and including a lock for locking off access to said last named means.

9. The security device of claim 8, wherein:
said device for use with a computer of the type that has a strong cabinet which is horizontally slidably received on its chassis and has a chassis that has vertical walls; and
wherein at least one of said bolt projections may enter the cabinet to project adjacent to a chassis vertical wall so as to prevent the slidable separation of the chassis from the cabinet.

10. The security device of claim 8, wherein
a tamper-resistant metal bracket is provided for overlaying the unit between the horizontal bolt projections, said bracket having apertures formed therein and sized to receive those projections;
whereby the bracket may overlay the unit and have the projections pass through the apertures in the said bracket, as well as project into the cabinet of the unit, so that said bracket is captivated by the bolt projections and serves to aid in preventing theft or vandalism of the unit.

11. An anti-theft device for securing a computer cabinet to a table or other top, comprising means for encircling at least the sides of the computer and the top under the computer for binding them together; said means including means projecting into the computer cabinet from the said encircling means to prevent the computer cabinet from being slid out of the encircling means; said encircling means also including lock means mounted at said projecting means for unlocking and releasing at least part of the projecting means, so as to allow the computer cabinet to be removed from the device;
said housing having means for receiving a cap screw and a lock cover for closing and locking an off access to the cap screw therein; and
wherein said encircling means includes a strong bar positioned under the top; said projecting means includes a generally L-shaped bolt member that is threadably connectable to said bar; said cap screw being also threadably connected to said bar, and said member and said cap screw each being able to be threadably advanced into said encircling means so as to accommodate different thicknesses of tops.

12. A kit of parts for forming the security device for securing a computer to a top, comprising:
a bar member having at least two spaced-apart internally-threaded holes formed therein, said holes being spaced apart by a distance slightly larger than the width of a computer to be secured;
a bolt member having a threaded shank that can be threaded vertically into one of said holes of said bar member and a horizontally-projecting bolt that may be received into the side of a computer; and
a lock assembly, comprising:
a housing having a horizontally-projecting bolt that may be inserted into the side of a computer;
a cap screw that may have its head seated in said housing with its threaded shank projecting out of the bottom of said housing so as to be vertically threadable into another threaded hole of said bar member; and
a lockable cover for securing to the lock housing for closing off access to the head of said cap screw when it is seated in said lock housing.

13. The kit of claim 12 which also includes:
a bracket of a generally inverted U-shape, sized and shaped to fit over the top of the computer and having holes formed at either side which holes are sized for closely receiving said horizontally projecting bolts.

14. The invention of claim 13, wherein said bracket includes projections for entering into holes or depressions formed in the cabinet of the computer.

15. The invention of claim 14, wherein said projections are fins that may enter and are sized to fit into pre-formed vent slots in the computer cabinet.

* * * * *